US012757343B2

(12) United States Patent
Lin

(10) Patent No.: US 12,757,343 B2
(45) Date of Patent: Oct. 6, 2026

(54) FIXING FRAME AND ELECTRONIC DEVICE

(71) Applicant: WISTRON CORP., New Taipei City (TW)

(72) Inventor: Bo-Chun Lin, New Taipei City (TW)

(73) Assignee: WISTRON CORP., New Taipei City (TW)

( * ) Notice: Subject to any disclaimer, the term of this patent is extended or adjusted under 35 U.S.C. 154(b) by 243 days.

(21) Appl. No.: 18/426,598

(22) Filed: Jan. 30, 2024

(65) Prior Publication Data

US 2025/0120032 A1 Apr. 10, 2025

(30) Foreign Application Priority Data

Oct. 6, 2023 (TW) ................................ 112138497

(51) Int. Cl.
*H05K 7/00* (2006.01)
*H05K 7/14* (2006.01)

(52) U.S. Cl.
CPC ......... *H05K 7/1415* (2013.01); *H05K 7/1487* (2013.01)

(58) Field of Classification Search
CPC ....... H05K 7/1415; H05K 7/1487; G06F 1/16
See application file for complete search history.

(56) References Cited

U.S. PATENT DOCUMENTS 5,871,365 A * 2/1999 Kajiura .............. G06K 13/0806 439/159
5,967,810 A * 10/1999 Spickler ............... H01R 13/635 439/159
6,030,238 A * 2/2000 Dong ................... H05K 5/0295 439/159
10,402,705 B2 * 9/2019 Mizawa ............... G06K 13/085
11,064,624 B2 * 7/2021 Sung .................... H05K 7/1409
11,800,673 B2 * 10/2023 Kuang ................. H05K 7/1489
(Continued)

FOREIGN PATENT DOCUMENTS

DE 202022104224 U1 * 8/2022 ............... G06F 1/20
EP 3306440 A1 * 4/2018 ............. G06F 1/185
TW M503601 U * 6/2015 ........... H05K 7/1487
(Continued)

OTHER PUBLICATIONS

TW Office Action dated Jun. 14, 2024 in Taiwan application No. 112138497.

*Primary Examiner* — Imani N Hayman
*Assistant Examiner* — Rashen E Morrison
(74) *Attorney, Agent, or Firm* — McClure, Qualey & Rodack, LLP

(57) ABSTRACT

This disclosure relates to a fixing frame including a guiding element, a movable element, and a handle. The guiding element is configured for an interface card to be placed into the guiding element along a first direction. The movable element is movably disposed in the guiding element. The movable element includes a pushing portion and an abutted portion. The handle is pivotably disposed on the guiding element. The handle includes an abutting portion. The abutting portion selectively abuts the abutted portion of the movable element, so that the pushing portion of the movable element pushes the interface card along a second direction opposite to the first direction.

20 Claims, 10 Drawing Sheets

(56) References Cited

U.S. PATENT DOCUMENTS

| | | | | |
|---|---|---|---|---|
| 2014/0044482 | A1* | 2/2014 | Crippen | G11B 33/124 403/322.4 |
| 2020/0253082 | A1* | 8/2020 | Yu | H05K 7/1489 |

FOREIGN PATENT DOCUMENTS

| | | | |
|---|---|---|---|
| TW | 202121769 | A | 6/2021 |
| TW | M640901 | U | 5/2023 |

* cited by examiner

FIXING FRAME AND ELECTRONIC DEVICE

CROSS-REFERENCE TO RELATED APPLICATIONS

This non-provisional application claims priority under 35 U.S.C. § 119 (a) on Patent Application No(s). 112138497 filed in Taiwan, R.O.C. on Oct. 6, 2023, the entire contents of which are hereby incorporated by reference.

TECHNICAL FIELD

The present disclosure relates to a fixing frame and an electronic device, more particularly to a fixing frame for easy removal of an interface card and an electronic device including the fixing frame.

BACKGROUND

With the popularity of the open compute project (OCP), electronic products compliant with the OCP specifications are more widely utilized now, such as OCP interface cards. Generally, in order to compactly arrange components in an internal space of an electronic device such as a server, there is no release structure particularly provided in the internal space for facilitating the removal of the OCP interface card.

Therefore, some parts of the OCP interface card having relatively high structural strength, such as heat dissipation fins, are held by fingers during the removal of the OCP interface card. However, holding these parts of the OCP interface card for the removal may easily damage the OCP interface card and thus cause the OCP interface card unable to be used again, and may even scratch the user's finger.

SUMMARY

The present disclosure provides a fixing frame and an electronic device for achieving easy removal of an interface card.

According to one aspect of the present disclosure, a fixing frame includes a guiding element, a movable element, and a handle. The guiding element is configured for an interface card to be placed into the guiding element along a first direction. The movable element is movably disposed in the guiding element. The movable element includes a pushing portion and an abutted portion. The handle is pivotably disposed on the guiding element. The handle includes an abutting portion. The abutting portion selectively abuts the abutted portion of the movable element, so that the pushing portion of the movable element pushes the interface card along a second direction opposite to the first direction.

According to the fixing frame and electronic device discussed above, the engagement between the interface card and the connector can be released easily or even effortlessly by simply holding the operation portion of the handle to pivot the handle. Then, the interface card can be held to be easily removed from the guiding elements. In the whole steps of the removal of the interface card, any electrical part of the interface card is not applied by an external force, which prevents any possible damage to the electrical part of the interface card and ensures the removed interface card to be reusable.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Aspects and advantages of the invention will become apparent from the following detailed descriptions with the accompanying drawings. For purposes of explanation, one or more specific embodiments are given to provide a thorough understanding of the invention, and which are described in sufficient detail to enable one skilled in the art to practice the described embodiments. It should be understood that the following descriptions are not intended to limit the embodiments to one specific embodiment. On the contrary, it is intended to cover alternatives, modifications, and equivalents as can be included within the spirit and scope of the described embodiments as defined by the appended claims.

Figure 1:
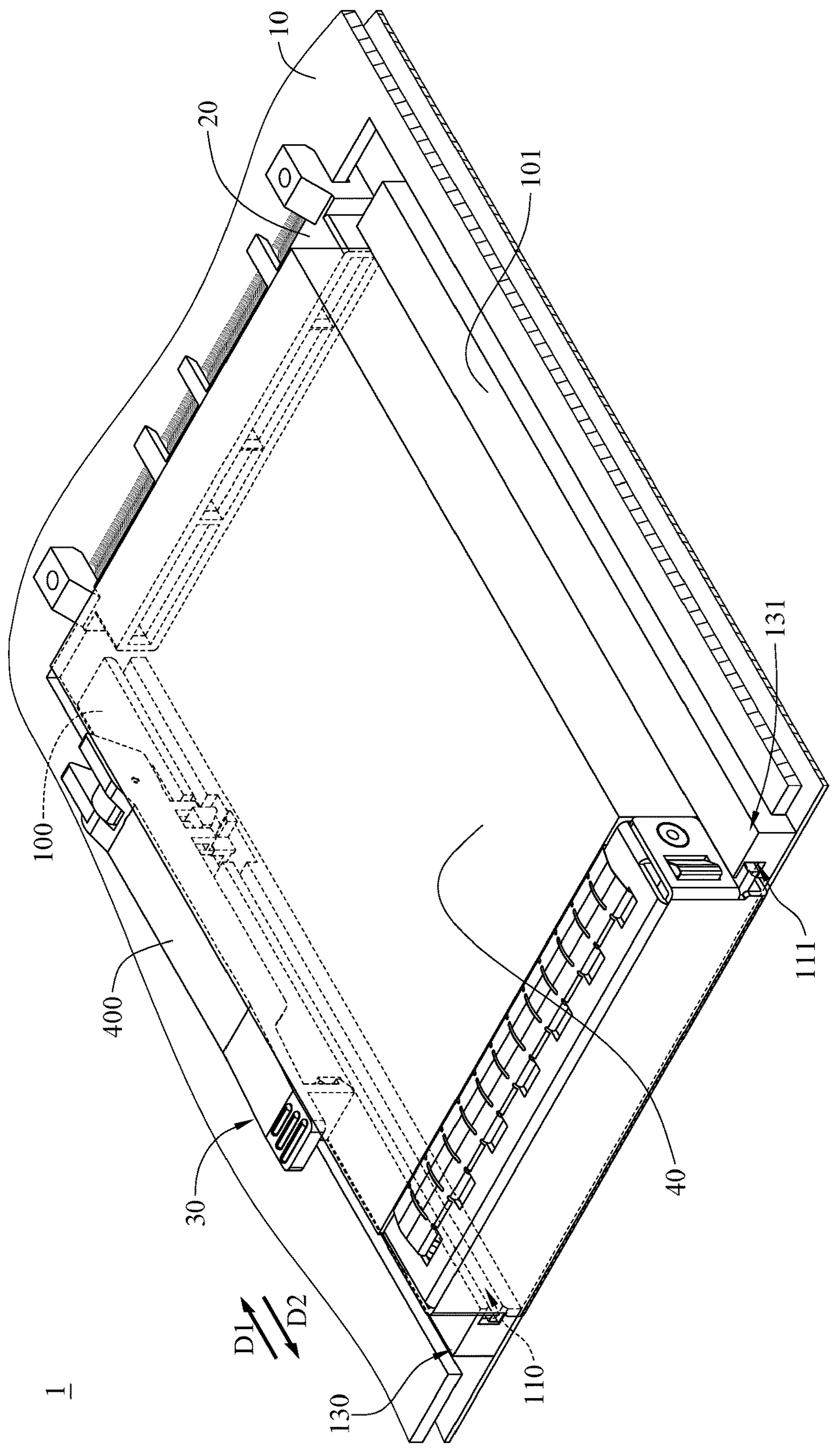
FIG. 1 is a partial perspective view of an electronic device according to one embodiment of the present disclosure.
Figure 2:
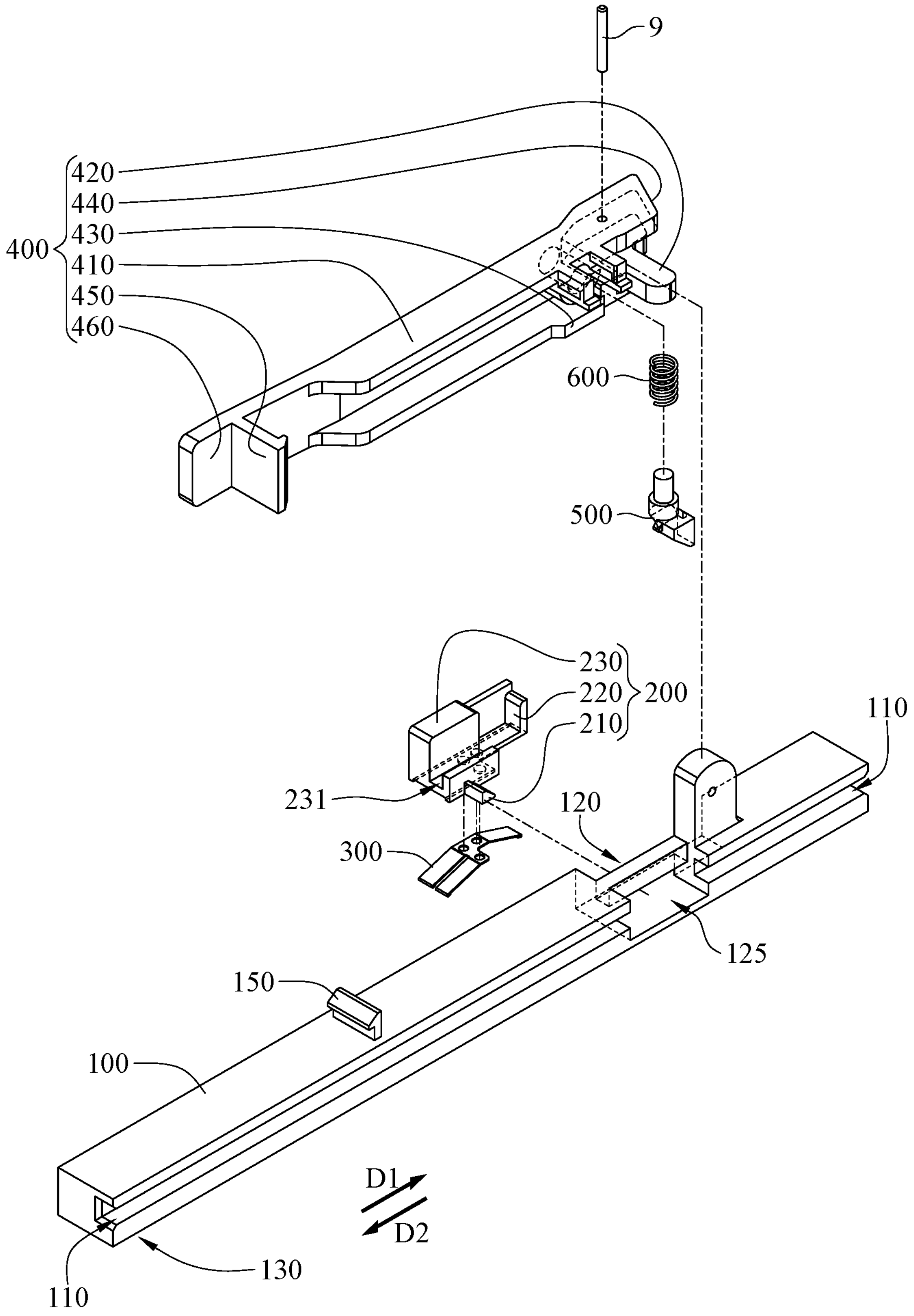
FIG. 2 is a partial and exploded view of a fixing frame of the electronic device in FIG. 1.

Please refer to FIG. 1 to FIG. 6, where FIG. 1 is a partial perspective view of an electronic device according to one embodiment of the present disclosure, FIG. 2 is a partial and exploded view of a fixing frame of the electronic device in FIG. 1, and FIG. 3 to FIG. 6 are cross-sectional views showing the removal of an interface card from the electronic device in FIG. 1.

An electronic device 1 provided in this embodiment may be, for example, a server. The electronic device 1 includes a motherboard 10, a connector 20, a fixing frame 30 and an interface card 40. The connector 20 is disposed on the motherboard 10 and can be electrically connected to the motherboard 10.

The fixing frame 30 is located at a side of the connector 20. More specifically, the fixing frame 30 may be, for example, disposed on the motherboard 10, but the present disclosure is not limited thereto. In some other embodiments of the present disclosure, the fixing frame may be disposed on a chassis of the electronic device. In this embodiment, the fixing frame 30 may include two guiding elements 100 and 101, a first engagement portion 150, a movable element 200, an elastic element 300, a handle 400, a blocking element 500 and a returning element 600.

The guiding elements 100 and 101 (e.g., slide rails) may be, for example, disposed in parallel to each other. The guiding elements 100 and 101 are respectively located close to two ends of the connector 20, so that the connector 20 is located between extension lines of the guiding elements 100 and 101, and the space between the guiding elements 100 and 101 can be used for placing the interface card 40. The guiding element 100 may include a groove 110, an accommodation space 120, a recessed portion 125 and an insertion end 130. The groove 110 can extend along a first direction D1. The accommodation space 120 can be located at the middle section of the groove 110 and can be in space communication connection with the groove 110. The recessed portion 125 can be located at a side of the groove 110 and can be in space communication connection with the groove 110 and the accommodation space 120. The insertion end 130 can be located at a side of the groove 110 away from the connector 20. Moreover, the guiding element 101 may be different from the guiding element 100. The guiding element 101 may have a groove 111 and an insertion end 131. The groove 111 can be located opposite to the groove 110. The insertion end 131 can be located at a side of the groove 111 away from the connector 20.

The first engagement portion 150 can be disposed on the guiding element 100 and can be located between the accommodation space 120 and the insertion end 130.

Figure 3:
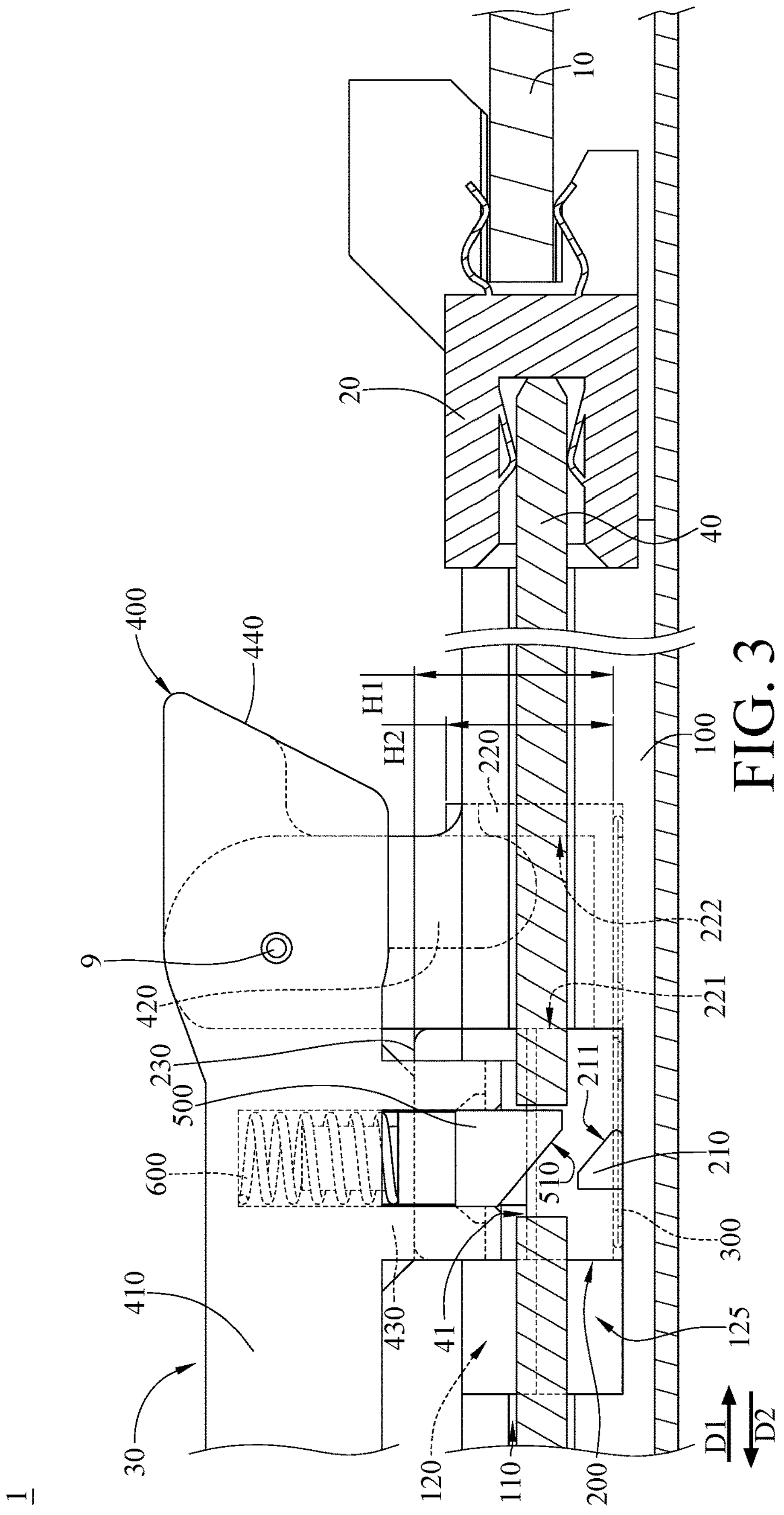
FIG. 3 to FIG. 6 are cross-sectional views showing the removal of an interface card from the electronic device in FIG. 1.
Figure 7:
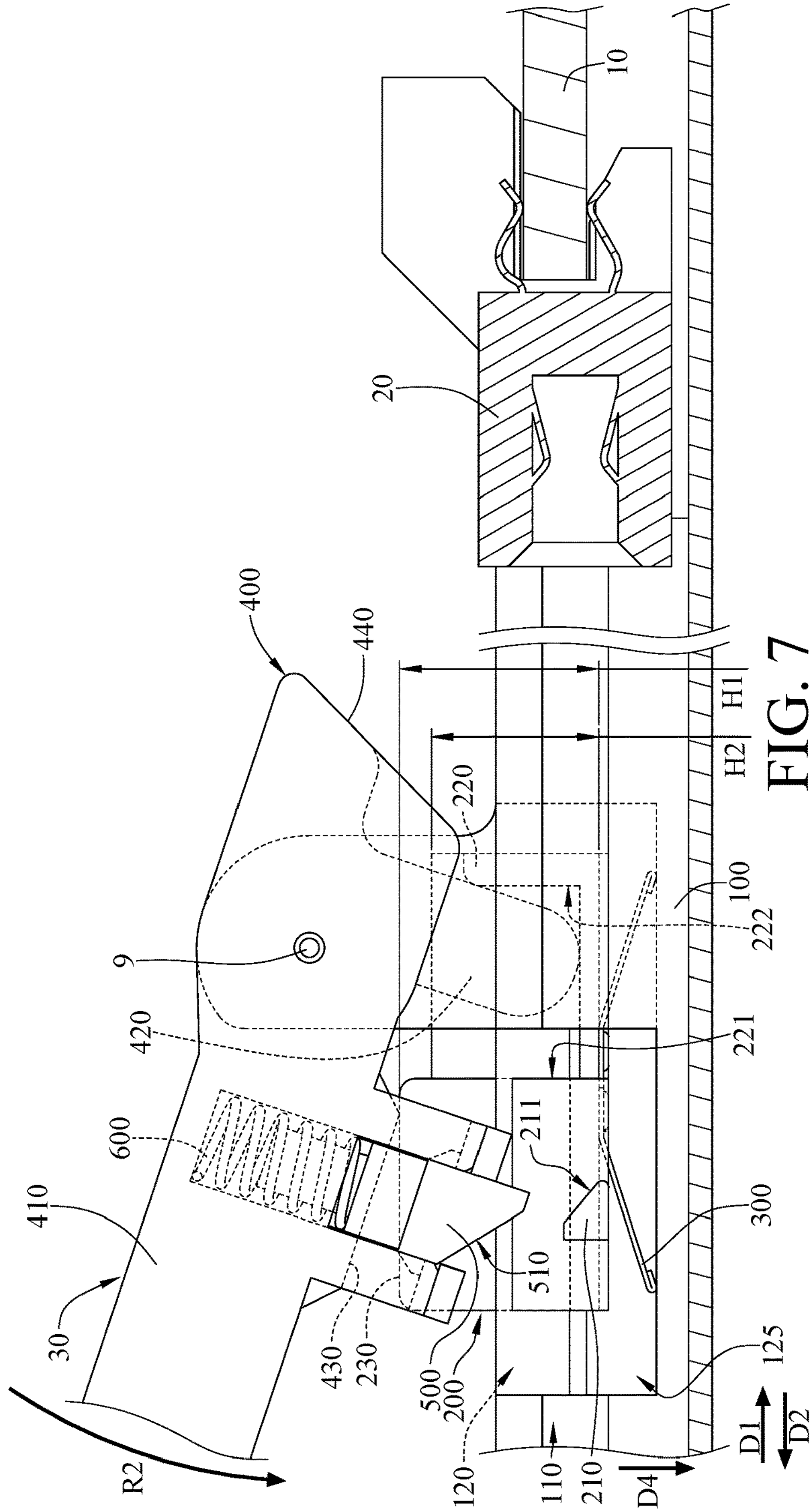
FIG. 7 to FIG. 8 are cross-sectional views showing the returning of a handle after removing the interface card from the electronic device in FIG. 1.

The movable element 200 is movably disposed in the accommodation space 120 of the guiding element 100. The movable element 200 may include a pushing portion 210, an abutted portion 220 and a pressed portion 230. The pushing portion 210 and the abutted portion 220 can be connected to the pressed portion 230 and can be connected to each other via the pressed portion 230. The pushing portion 210 may have a first inclined surface 211. The first inclined surface 211 can face away from the insertion end 130. It can be considered that the first inclined surface 211 can face the connector 20. The abutted portion 220 may be a recess structure. The abutted portion 220 may have a first abutted surface 221 and a second abutted surface 222 that face each other. The first abutted surface 221 can be located closer to the insertion end 130 than the second abutted surface 222. A height H1 of the pressed portion 230 can be greater than a height H2 of the abutted portion 220, as shown in FIG. 3 and FIG. 7.

The elastic element 300 may be, for example, a sheet-shaped spring. The elastic element 300 is elastically deformable and can be disposed on the pressed portion 230 of the movable element 200 and located in the recessed portion 125.

The handle 400 can be pivotably disposed on the guiding element 100 via, for example, a pin 9. The handle 400 may include a main portion 410, an abutting portion 420, a pressing portion 430, a restriction portion 440, a second engagement portion 450 and an operation portion 460. The abutting portion 420, the pressing portion 430 and the restriction portion 440 can be connected to a side of the main portion 410. The abutting portion 420 may be a protruded structure and can be located between the first abutted surface 221 and the second abutted surface 222 of the abutted portion 220 as the recess structure. The pressing portion 430 and the restriction portion 440 can be connected to the abutting portion 420 via the main portion 410. The pressing portion 430 can face a side of the pressed portion 230 located farther away from the elastic element 300. The restriction portion 440 can face the guiding element 100, and the guiding element 100 can be located on a pivoting path of the restriction portion 440 so as to restrict a pivoting angle of the handle 400. The second engagement portion 450 and the operation portion 460 can be connected to a side of the main portion 410 located farther away from the abutting portion 420, the pressing portion 430 and the restriction portion 440, and can be connected to the abutting portion 420 via the main portion 410. The second engagement portion 450 can correspond to the first engagement portion 150 and is detachably engaged with the first engagement portion 150 so as to restrict the pivoting of the handle 400 with respect to the guiding element 100. The operation portion 460 can be operated so that the handle 400 is pivoted with respect to the guiding element 100.

The blocking element 500 is movably disposed on the main portion 410 of the handle 400. The blocking element 500 may have a second inclined surface 510. The second inclined surface 510 can face the insertion end 130. It can be considered that the second inclined surface 510 can face away from the connector 20.

The returning element 600 may be, for example, a compression spring. The returning element 600 can be disposed between the main portion 410 of the handle 400 and the blocking element 500. Two opposite sides of the returning element 600 can respectively press against the main portion 410 and the blocking element 500 so as to maintain relative position relationship between the main portion 410 of the handle 400 and the blocking element 500.

The interface card 40 may be compliant with the specification of the open compute project (OCP). The interface card 40 is slidably disposed in the grooves 110 and 111 of the guiding elements 100 and 101, and is detachably connected to the connector 20.

Before mounting the interface card 40, the second engagement portion 450 of the handle 400 can be engaged with the first engagement portion 150 to prevent unwanted pivoting of the handle 400 with respect to the guiding element 100 due to an external force such as vibration. Then, as shown in FIG. 1 and FIG. 3, the interface card 40 can be inserted into the grooves 110 and 111 of the guiding elements 100 and 101 along a first direction D1 from the insertion ends 130 and 131 of the guiding elements 100 and 101, and then the interface card 40 can be connected to the connector 20 to establish the electrical connection between the interface card 40 and the motherboard 10 via the connector 20. At this moment, the pressing portion 430 of the handle 400 presses the pressed portion 230 of the movable element 200, such that the pushing portion 210 of the movable element 200 is located in the recessed portion 125 instead of the groove 110 and the notch 41 of the interface card 40, and the pressing portion 430 presses the pressed portion 230 to compress the elastic element 300. Moreover, the blocking element 500 disposed on the handle 400 is located in the groove 110 and the notch 41 of the interface card 40.

Figure 4:
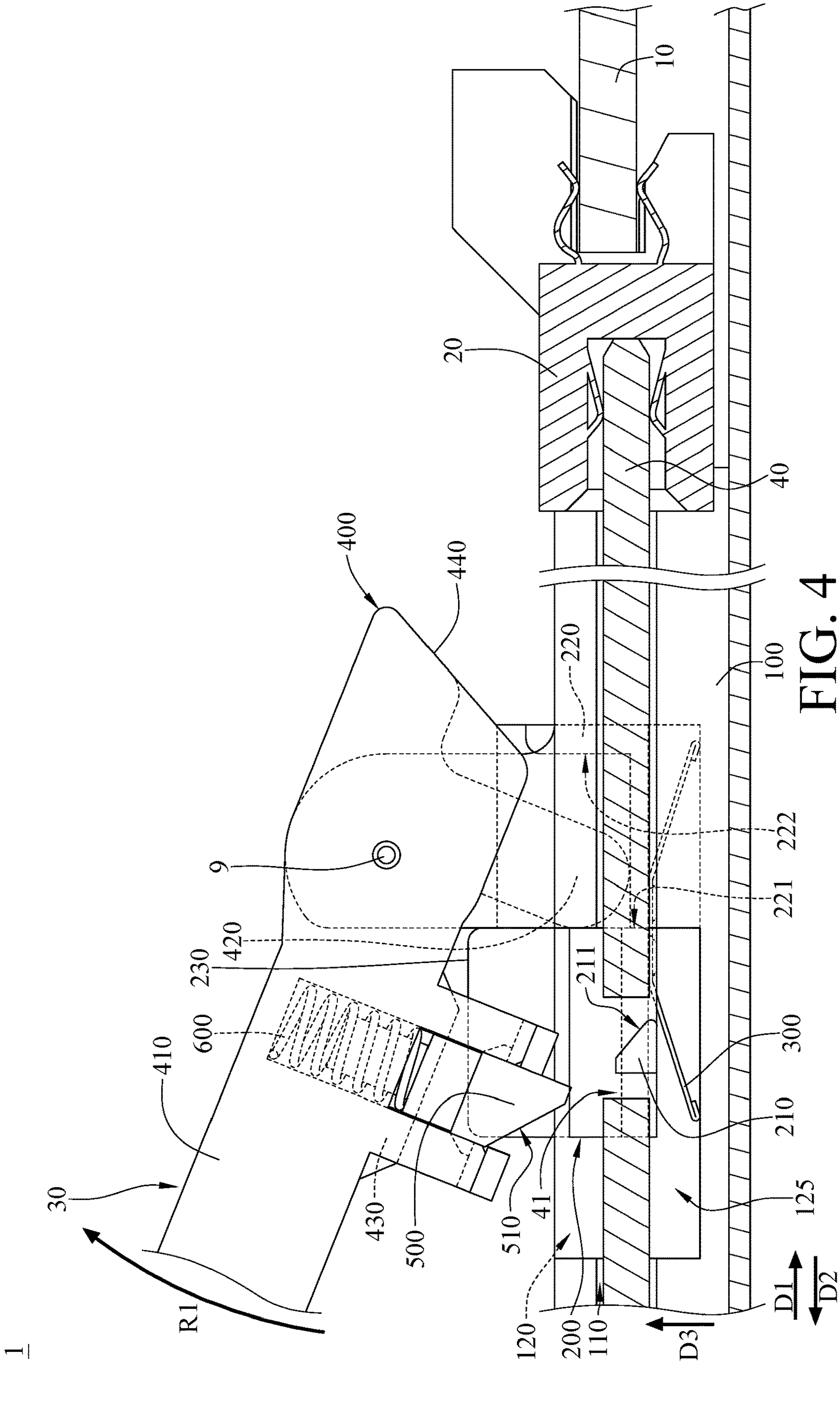

In the following, the steps of the removal of the interface card 40 will be illustrated. First, the operation portion 460 can be operated to release the engagement between the second engagement portion 450 and the first engagement portion 150. Then, the handle 400 can be pivoted with respect to the guiding element 100 along a pivoting direction R1 denoted in FIG. 4. During the pivoting of the handle 400, the blocking element 500 is moved away from the groove 110 and the notch 41 of the interface card 40. Moreover, since the pressing portion 430 no longer presses the pressed portion 230 and the elastic element 300, the elastic element 300 can return to its usual shape and push the pressed portion 230 to move the pushing portion 210 into the groove 110 and the notch 41 of the interface card 40 from the recessed portion 125 along a third direction D3 perpendicular to the first direction D1, as shown in FIG. 4. Moreover, the pressed portion 230 has a gap 231 for accommodating a part of the guiding element 100 when the pressed portion 230 of the movable element 200 moves along the third direction D3.

Figure 5:
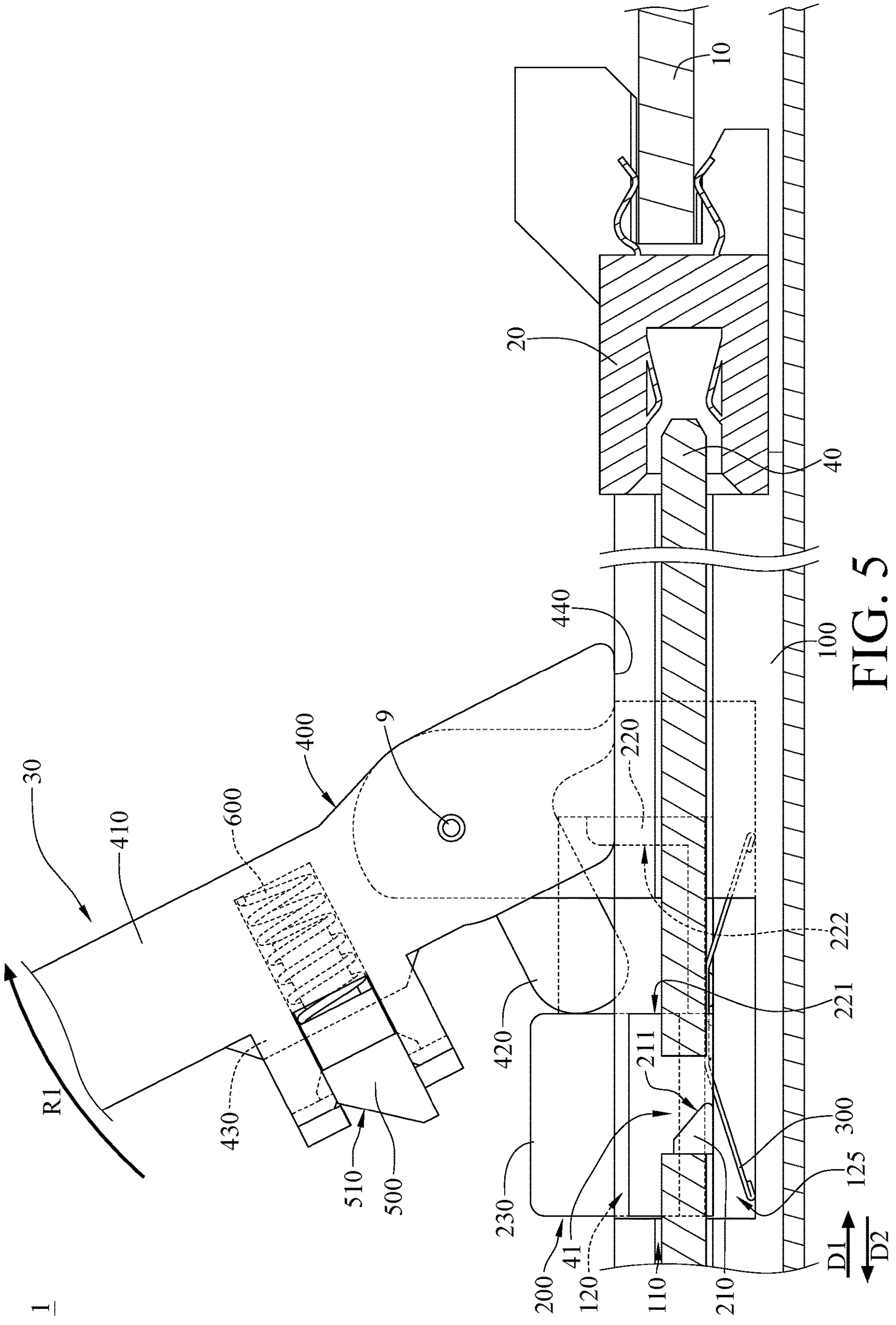

Then, the handle 400 can be further pivoted along the pivoting direction R1 until the restriction portion 440 of the handle 400 abuts on the guiding element 100, as shown in FIG. 5. During the pivoting of the handle 400 with respect to the guiding element 100 along the pivoting direction R1, the abutting portion 420 can abut on the first abutted surface 221 of the abutted portion 220, such that the movable element 200 is moved away from the connector 20 along a second direction D2 opposite to the first direction D1 for forcing the pushing portion 210 of the movable element 200 to push the interface card 40 along the second direction D2.

Figure 6:
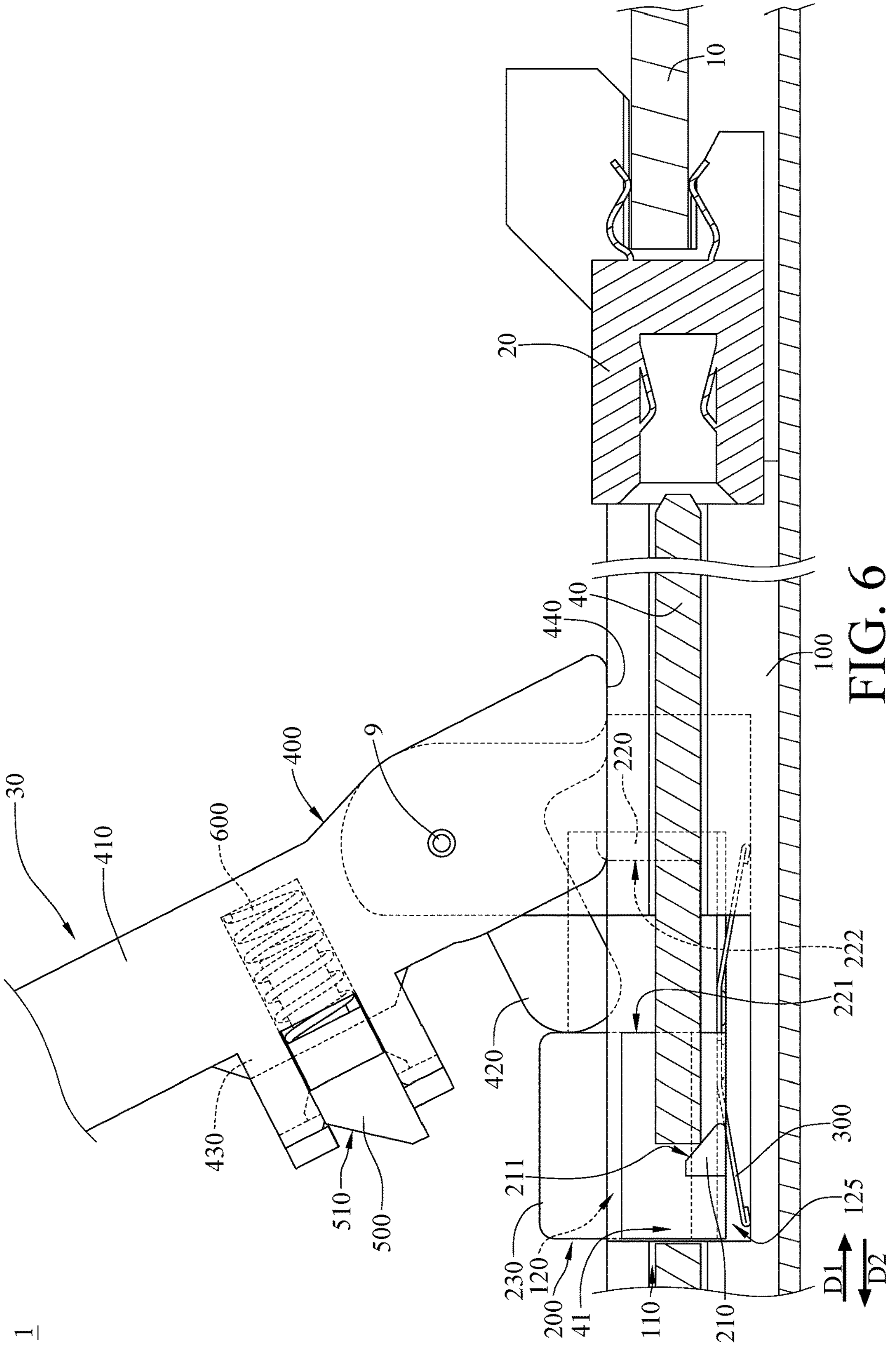

Accordingly, the engagement between the interface card 40 and the connector 20 can be released easily or even effortlessly by simply holding the operation portion 460 of the handle 400 to pivot the handle 400. Then, the interface card 40 can be held to be easily removed from the guiding elements 100 and 101. During the removal of the interface card 40, the first inclined surface 211 of the pushing portion 210 can be abutted by the interface card 40 to slightly press down the pushing portion 210 instead of blocking the removal path of the interface card 40, as shown in FIG. 6. Moreover, the pushing portion 210 can be moved into the groove 110 by the elastic element 300 when the interface card 40 no longer abuts on the pushing portion 210 during the removal of the interface card 40 away from the guiding element 100. In the whole steps of the removal of the interface card 40, any electrical part of the interface card 40 is not applied by an external force, which prevents any possible damage to the electrical part of the interface card 40 and ensures the removed interface card 40 to be reusable.

Figure 8:
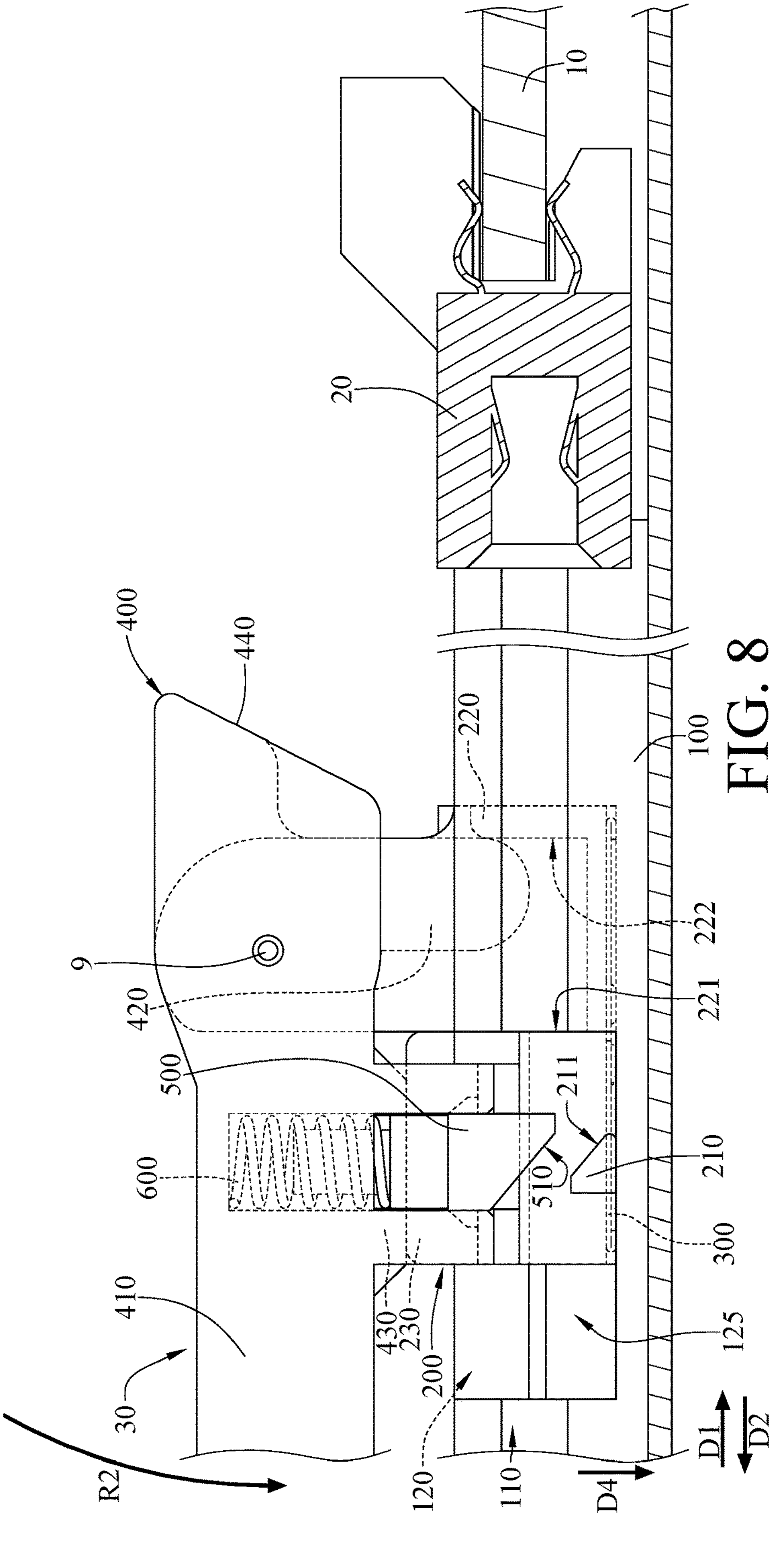

In the following, the steps of the returning of the handle 400 will be illustrated. Please further refer to FIG. 7 and FIG. 8 together with FIG. 1 and FIG. 2, where FIG. 7 to FIG. 8 are cross-sectional views showing the returning of a handle after removing the interface card from the electronic device in FIG. 1.

As shown in FIG. 7, the handle 400 can be pivoted with respect to the guiding element 100 along a returning direction R2 opposite to the pivoting direction R1. During the pivoting of the handle 400 along the returning direction R2, the pressing portion 430 of the handle 400 can press the pressed portion 230 instead of the abutted portion 220 since the pressed portion 230 has a height H1 greater than a height H2 of the abutted portion 220. The pressed portion 230 pressed by the pressing portion 430 is able to move the pushing portion 210 into the recessed portion 125 from the groove 110 along a fourth direction D4 opposite to the third direction D3 until the elastic element 300 is completely compressed. Also, during the pivoting of the handle 400 with respect to the guiding element 100 along the returning direction R2, the abutting portion 420 can abut on the second abutted surface 222 of the abutted portion 220, such that the movable element 200 is moved to its original position along the first direction D1 towards the connector 20, as shown in FIG. 8. Moreover, the blocking element 500 disposed on the handle 400 is moved into the groove 110 again with the pivoting of the handle 400 along the returning direction R2. Further, the second engagement portion 450 of the handle 400 can be engaged with the first engagement portion 150 again.

In the following, the steps of the insertion of the interface card 40 will be illustrated. Please refer to FIG. 9 and FIG. 10 together with FIG. 1 to FIG. 3, where FIG. 9 to FIG. 10 are cross-sectional views showing the insertion of the interface card into the electronic device in FIG. 1.

Figure 9:
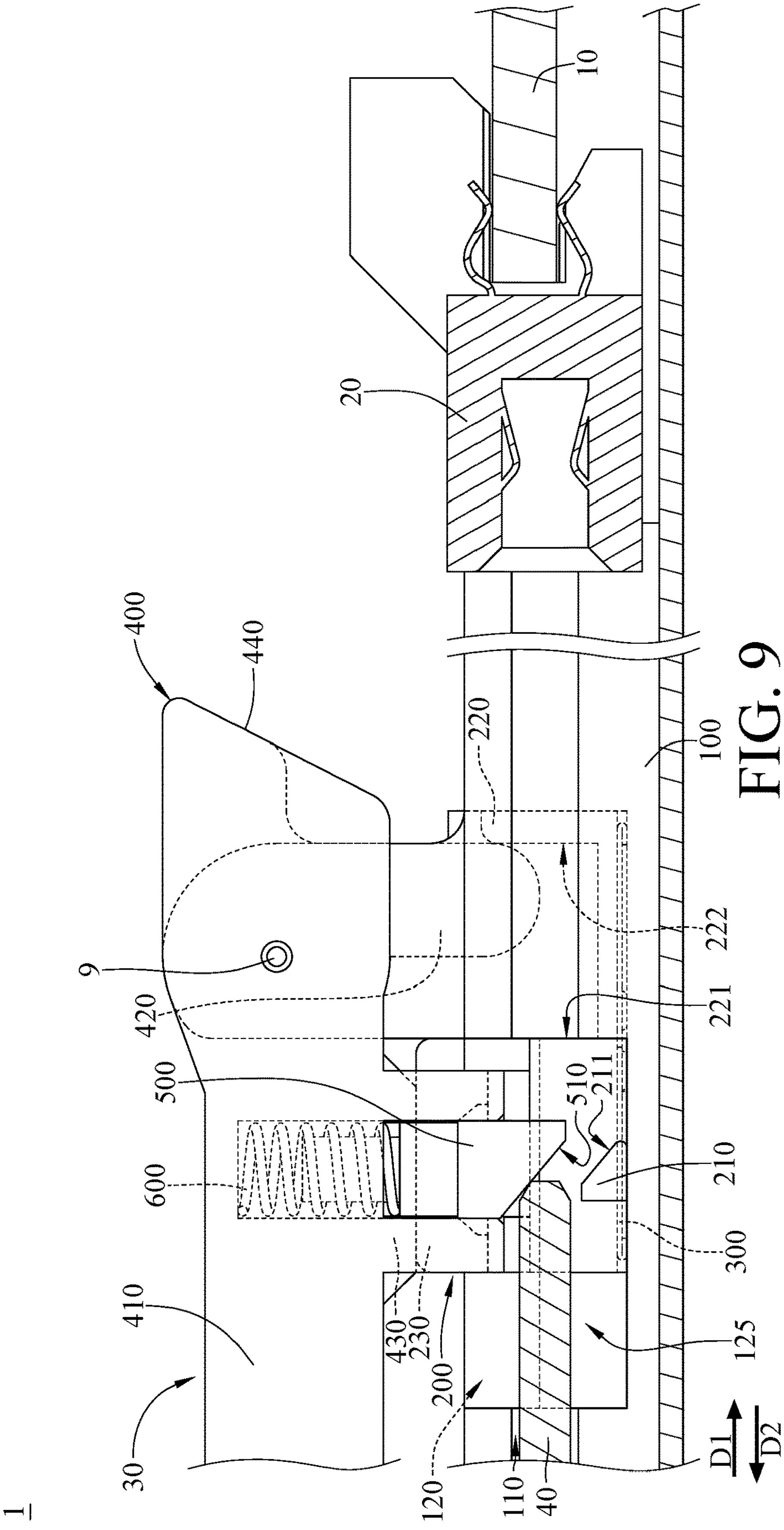
FIG. 9 to FIG. 10 are cross-sectional views showing the insertion of the interface card into the electronic device in FIG. 1.
Figure 10:
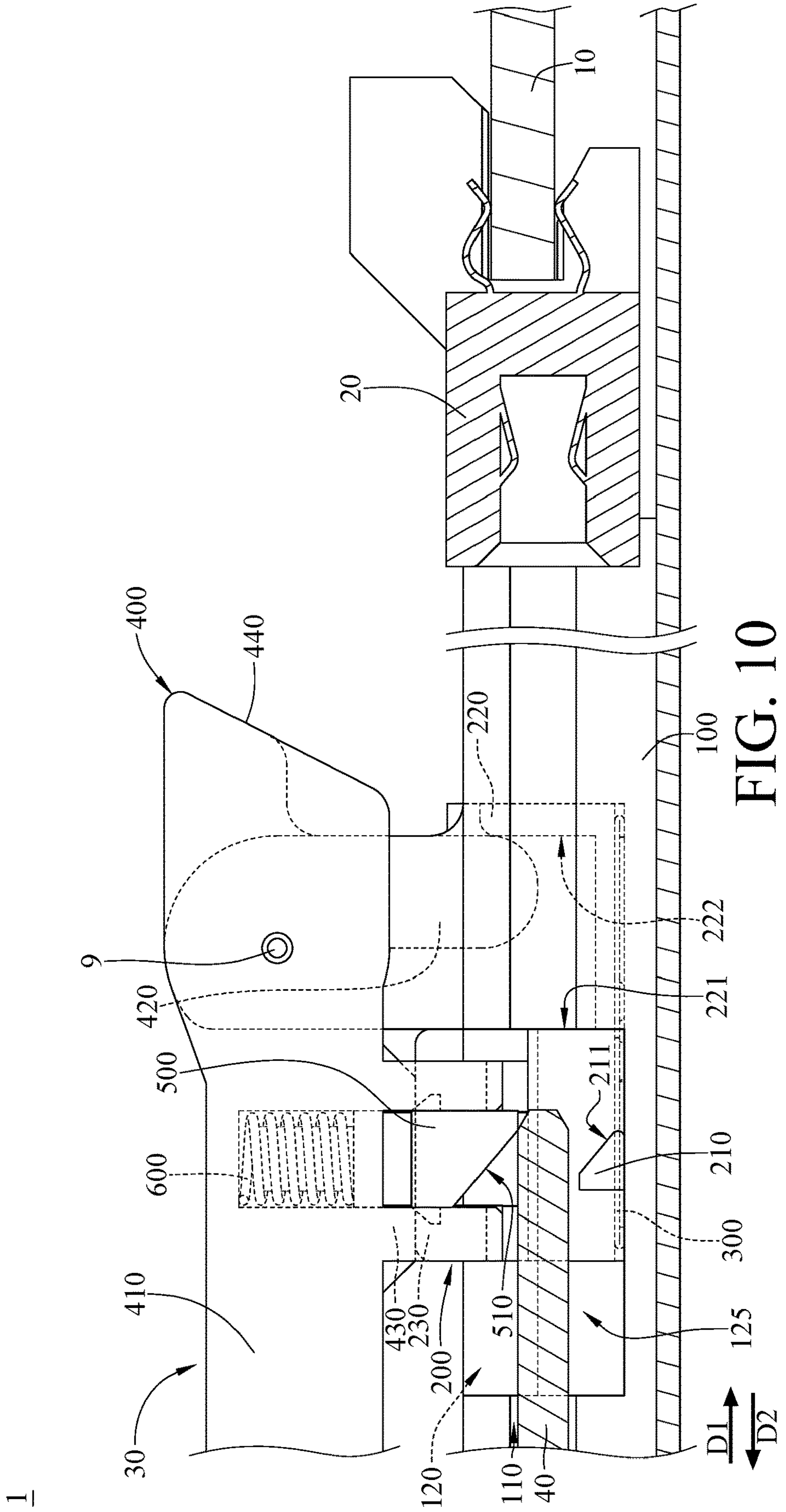

As shown in FIG. 9, the interface card 40 can be inserted into the grooves 110 and 111 of the guiding elements 100 and 101 along the first direction D1 from the insertion ends 130 and 131 of the guiding elements 100 and 101. When the interface card 40 is moved to the blocking element 500, the interface card 40 can abut on the second inclined surface 510 of the blocking element 500 to compress the returning element 600 via the blocking element 500, and thus the blocking element 500 and the returning element 600 are moved towards the handle 400 instead of blocking the insertion path of the interface card 40, as shown in FIG. 10.

Then, the interface card 40 can be further moved along the first direction D1 until reaching the connector 20 to establish the connection with the connector 20, as shown in FIG. 3. At this moment, the notch 41 of the interface card 40 is located in the accommodation space 120 and aligned with the blocking element 500. The blocking element 500 is then moved into the notch 41 by the compressed returning element 600 so as to block the movement of the interface card 40 along the second direction D2, which prevents the detachment of the interface card 40 from the connector 20 due to an external force, such as vibration.

Accordingly, the insertion of the interface card 40 can be conveniently performed without pivoting the handle 400 during the insertion of the interface card 40. If the interface card 40 need to be removed again, the abovementioned steps of pivoting the handle 400 can be performed again for easily removing the interface card 40.

Please noted that in the present embodiment, the guiding element 101 is different from the guiding element 100 in structure, but the present disclosure is not limited thereto. In some other embodiments of the present disclosure, two guiding elements may be the same in structure for disposing the two same groups of movable elements, elastic elements, handles, blocking elements and returning elements.

According to the fixing frame and electronic device discussed above, the engagement between the interface card and the connector can be released easily or even effortlessly by simply holding the operation portion of the handle to pivot the handle. Then, the interface card can be held to be easily removed from the guiding elements. In the whole steps of the removal of the interface card, any electrical part of the interface card is not applied by an external force, which prevents any possible damage to the electrical part of the interface card and ensures the removed interface card to be reusable.

Moreover, with the design of the second inclined surface, the insertion of the interface card can be conveniently performed without pivoting the handle during the insertion of the interface card.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A fixing frame, comprising:

a guiding element, configured for placing an interface card therein along a first direction;

a movable element, movably disposed in the guiding element, wherein the movable element comprises a pushing portion and an abutted portion; and a handle, pivotably disposed on the guiding element, wherein the handle comprises an abutting portion, the abutting portion selectively abuts the abutted portion of the movable element, so that a pivoting movement of the handle forces the pushing portion of the movable element to push the interface card along a second direction opposite to the first direction, wherein during the pivoting movement of the handle, the abutting portion directly abuts the abutted portion to mechanically drive the movable element along the second direction.

2. The fixing frame according to claim 1, further comprising an elastic element, wherein the guiding element has a groove configured for inserting the interface card therein, and the elastic element is disposed on the movable element for moving the movable element along a third direction perpendicular to the second direction.

3. The fixing frame according to claim 2, wherein the movable element further comprises a pressed portion connected to the pushing portion and the abutted portion, the pressed portion has a height greater than a height of the abutted portion, and the handle further comprises a pressing portion; when the pressing portion presses the pressed portion, the pressing portion moves the pushing portion along a fourth direction opposite to the third direction.

4. The fixing frame according to claim 3, wherein the elastic element selectively moves the pushing portion of the movable element to be aligned with the groove, and the pressing portion selectively presses the pressed portion to move the pushing portion away from the groove of the guiding element.

5. The fixing frame according to claim 1, wherein the movable element further comprises a pressed portion, the pushing portion and the abutted portion are connected to adjacent sides of the pressed portion, the pushing portion is protruded from the pressed portion, the abutted portion is a recess structure for accommodating the abutting portion of the handle, the pressed portion has a height greater than a height of the abutted portion, the pressed portion has a gap for accommodating a part of the guiding element when the movable element is moved along a third direction perpendicular to the second direction.

6. The fixing frame according to claim 1, wherein the abutted portion has a first abutted surface and a second abutted surface that face each other; when the handle pivots, the abutting portion abuts the first abutted surface for moving the movable element away from the guiding element or abuts the second abutted surface for moving the movable element towards the guiding element.

7. The fixing frame according to claim 1, wherein the handle further comprises a restriction portion that selectively abuts the guiding element for restricting a pivoting angle of the handle.

8. The fixing frame according to claim 1, further comprising a first engagement portion disposed on the guiding element, wherein the handle further comprises a second engagement portion connected to the abutting portion, and the second engagement portion is detachably engaged with the first engagement portion.

9. The fixing frame according to claim 8, further comprising a blocking element and a returning element, wherein the blocking element is movably disposed on the handle, the returning element is disposed between the handle and the blocking element, the guiding element has a groove configured for inserting the interface card therein; when the second engagement portion is engaged with the first engagement portion, the blocking element is located in the groove of the guiding element for blocking the interface card.

10. The fixing frame according to claim 9, wherein the pushing portion has a first inclined surface, and the blocking element has a second inclined surface.

11. The fixing frame according to claim 1, further comprising an elastic element, a blocking element and a returning element, wherein the guiding element has a groove configured for inserting the interface card therein, the elastic element is disposed on the movable element for moving the movable element along a third direction perpendicular to the second direction, the blocking element is movably disposed on the handle, the blocking element is selectively located in the groove of the guiding element for blocking the interface card, the returning element is disposed between the handle and the blocking element; the movable element further comprises a pressed portion connected to the pushing portion and the abutted portion, the pressed portion has a height greater than a height of the abutted portion, the pushing portion has a first inclined surface, the blocking element has a second inclined surface, and the handle further comprises a pressed portion for selectively pressing the pressed portion to move the pushing portion along a fourth direction opposite to the third direction.

12. An electronic device, comprising:
- a motherboard;
- a connector, disposed on the motherboard;
- a fixing frame, located at a side of the connector, the fixing frame comprising:

a guiding element;
- a movable element, movably disposed in the guiding element, wherein the movable element comprises a pushing portion and an abutted portion; and
- a handle, pivotably disposed on the guiding element, wherein the handle comprises an abutting portion; and
- an interface card, placed into the guiding element along a first direction and connected to the connector;
- wherein the abutting portion selectively abuts the abutted portion of the movable element, so that a pivoting movement of the handle forces the pushing portion of the movable element to push the interface card along a second direction opposite to the first direction,
- wherein during the pivoting movement of the handle, the abutting portion directly abuts the abutted portion to mechanically drive the movable element along the second direction.

13. The electronic device according to claim 12, wherein the fixing frame further comprises an elastic element that is disposed on the movable element for moving the pushing portion of the movable element into a notch of the interface card along a third direction perpendicular to the second direction.

14. The electronic device according to claim 13, wherein the movable element further comprises a pressed portion connected to the pushing portion and the abutted portion, the pressed portion has a height greater than a height of the abutted portion, and the handle further comprises a pressed portion; when the pressing portion of the handle presses the pressed portion, the pressing portion moves the pushing portion away from the notch of the interface card along a fourth direction opposite to the third direction.

15. The electronic device according to claim 12, wherein the abutted portion has a first abutted surface and a second abutted surface that face each other; when the handle pivots, the abutting portion abuts the first abutted surface for moving the movable element away from the connector or abuts the second abutted surface for moving the movable element towards the connector.

16. The electronic device according to claim 12, wherein the handle further comprises a restriction portion that selectively abuts the guiding element for restricting a pivoting angle of the handle.

17. The electronic device according to claim 12, wherein the fixing frame further comprises a first engagement portion disposed on the guiding element, the handle further comprises a second engagement portion connected to the abutting portion, and the second engagement portion is detachably engaged with the first engagement portion.

18. The electronic device according to claim 17, wherein the fixing frame further comprises a blocking element and a returning element, the blocking element is movably disposed on the handle, and the returning element is disposed between the handle and the blocking element; when the second engagement portion is engaged with the first engagement portion, the blocking element is located in a notch of the interface card for blocking the interface card.

19. The electronic device according to claim 18, wherein the pushing portion has a first inclined surface, and the blocking element has a second inclined surface.

20. The electronic device according to claim 12, wherein the fixing frame further comprises an elastic element, a blocking element and a returning element, the elastic element is disposed on the movable element for moving the movable element along a third direction perpendicular to the second direction, the blocking element is movably disposed on the handle, the blocking element is selectively located in a notch of the interface card for blocking the interface card, the returning element is disposed between the handle and the blocking element; the movable element further comprises a pressed portion connected to the pushing portion and the abutted portion, the pressed portion has a height greater than a height of the abutted portion, the pushing portion has a first inclined surface, the blocking element has a second inclined surface, and the handle further comprises a pressing portion for selectively pressing the pressed portion to move the pushing portion along a fourth direction opposite to the third direction.

* * * * *